US008999529B2

(12) United States Patent
Tetsuka et al.

(10) Patent No.: US 8,999,529 B2
(45) Date of Patent: Apr. 7, 2015

(54) NITROGEN-CONTAINING GRAPHENE STRUCTURE AND PHOSPHOR DISPERSION

(75) Inventors: Hiroyuki Tetsuka, Aichi (JP); Kazuo Okamoto, Miyoshi (JP)

(73) Assignee: Kabushiki Kaisha Toyota Chuo Kenkyusho, Nagakute-shi (JP)

( * ) Notice: Subject to any disclaimer, the term of this patent is extended or adjusted under 35 U.S.C. 154(b) by 0 days.

(21) Appl. No.: 13/824,851

(22) PCT Filed: Aug. 24, 2011

(86) PCT No.: PCT/JP2011/069033
§ 371 (c)(1),
(2), (4) Date: Mar. 18, 2013

(87) PCT Pub. No.: WO2012/086260
PCT Pub. Date: Jun. 28, 2012

(65) Prior Publication Data
US 2013/0181165 A1    Jul. 18, 2013

(30) Foreign Application Priority Data

Dec. 24, 2010  (JP) ................................. 2010-288067
Jun. 23, 2011  (JP) ................................. 2011-139963

(51) Int. Cl.
C09K 11/06    (2006.01)
C09K 11/65    (2006.01)
B82Y 30/00    (2011.01)
B82Y 40/00    (2011.01)
C01B 31/04    (2006.01)
H01L 33/50    (2010.01)

(52) U.S. Cl.
CPC ......... C09K 11/06 (2013.01); *C09K 2211/1011* (2013.01); *C01B 31/0476* (2013.01); *C01B 2204/20* (2013.01); *C09K 2211/1416* (2013.01); C09K 11/65 (2013.01); *H01L 33/502* (2013.01); *C01B 2204/30* (2013.01); C01B 31/0484 (2013.01); B82Y 30/00 (2013.01); B82Y 40/00 (2013.01)

(58) Field of Classification Search
None
See application file for complete search history.

(56) References Cited

U.S. PATENT DOCUMENTS

| 6,329,083 | B1 * | 12/2001 | Toguchi et al. ............... 428/690 |
| 6,465,116 | B1 * | 10/2002 | Ishikawa et al. .............. 428/690 |
| 2005/0106415 | A1 * | 5/2005 | Jarikov et al. ................ 428/690 |
| 2007/0216292 | A1 | 9/2007 | Seo et al. |
| 2010/0237296 | A1 | 9/2010 | Gilje |
| 2010/0301279 | A1 | 12/2010 | Nesper et al. |
| 2011/0049437 | A1 | 3/2011 | Crain et al. |
| 2013/0181166 | A1 | 7/2013 | Tetsuka |
| 2014/0212668 | A1 * | 7/2014 | Dichtel et al. ................ 428/402 |

FOREIGN PATENT DOCUMENTS

| CN | 101818059 A | 9/2010 |
| JP | A-2010-173886 | 8/2010 |
| JP | A-2010-222245 | 10/2010 |
| JP | A-2010-232511 | 10/2010 |
| JP | A-2010-275186 | 12/2010 |
| WO | WO 2009/049375 A1 | 4/2009 |
| WO | WO 2009/123771 A2 | 10/2009 |

OTHER PUBLICATIONS

U.S. Appl. No. 61/479,998, filed Apr. 28, 2011.*
Wang et al., "Synthesis and characterisation of hydrophilic and organophilic graphene nanosheets," *Carbon*, 2009, pp. 1359-1364, vol. 47, Elsevier Ltd.
Pan et al., "Hydrothermal Route for Cutting Graphene Sheets into Blue-Luminescent Graphene Quantum Dots," *Advanced Materials*, 2010, pp. 734-738, vol. 22, Wiley-VCH Verlag GmbH & Co. KGaA, Weinheim, DE.
Eda et al., "Blue Photoluminescence from Chemically Derived Graphene Oxide," *Advanced Materials*, 2010, pp. 505-509, vol. 22, Wiley-VCH Verlag GmbH & Co. KGaA, Weinheim, DE.
Mueller et al., "Triplet States and Electronic Relaxation in Photoexcited Graphene Quantum Dots," *Nano Letters*, 2010, pp. 2679-2682, vol. 10, American Chemical Society.
International Search Report issued in International Application No. PCT/JP2011/069033 dated Dec. 6, 2011.
English-Language Translation of the International Preliminary Report on Patentability issued in International Application No. PCT/JP2011/069033 dated Jan. 8, 2013.
Dec. 20, 2013 Office Action issued in U.S. Appl. No. 13/824,830.
Pan et al., "Hydrothermal Route for Cutting Graphene Sheets into Blue-Luminescent Graphene Quantum Dots," Adv Mater., 2009, vol. 21, pp. 1-5.
Nov. 29, 2011 International Search Report issued in International Patent Application No. PCT/JP2011/069034.
Nov. 29, 2011 Written Opinion of the International Searching Authority issued in International Patent Application No. PCT/JP2011/069034 (with partial translation).
Apr. 4, 2013 International Preliminary Report on Patentability issued in International Patent Application No. PCT/JP2011/069034 (with translation).

(Continued)

Primary Examiner — Marie R. Yamnitzky
(74) Attorney, Agent, or Firm — Oliff PLC

(57) ABSTRACT

A nitrogen-containing graphene structure has a graphene structure including a monolayer or multilayer graphene nanosheet and nitrogen introduced into the graphene structure. The nitrogen-containing graphene structure preferably includes the above-described graphene structure having a sheet portion comprised of a monolayer or multilayer graphene nanosheet and containing, at an edge portion thereof, an armchair edge-face portion and a terminal six-membered ring bound to the armchair edge-face portion while sharing only one side therewith; and a nitrogen-containing functional group bound to any one or more carbon atoms selected from (a) the carbon atoms constituting the terminal six-membered ring but not bound to the armchair edge-face portion, and (b) the carbon atoms constituting the sheet portion (including the carbon atom on the side shared by the terminal six-membered ring). A phosphor dispersion is a dispersion of such a nitrogen-containing graphene structure in a solvent.

4 Claims, 7 Drawing Sheets

(56) References Cited

OTHER PUBLICATIONS

Aug. 13, 2013 Japanese Office Action issued in Application No. 2010-288068 (with English translation).
Dec. 18, 2013 Office Action issued in Japanese Patent Application No. 2010-288067 (with translation).
Yang et al., "Graphene In Mice: Ultrahigh in Vivo Tumor Uptake and Efficient Photothermal Therapy", Nano Letters, Aug. 4, 2010, vol. 10, pp. 3318-3323.
May 27, 2014 Office Action issued in Japanese Patent Application No. 2011-139963 w/translation.
May 2, 2014 Office Action issued in U.S. Appl. No. 13/824,830.
Oct. 3, 2014 Office Action issued in U.S. Appl. No. 13/824,830.
Tetsuka et al., "Optically Tunable Amino-Functionalized Graphene Quantum Dots," Advanced Materials, 2012, 24, pp. 5333-5338.
Tian et al., "Tailoring surface groups of carbon quantum dots to improve photoluminescence behaviors," Applied Surface Science, 2014, 301, pp. 156-160.
Radovic et al., "On the Chemical Nature of Graphene Edges: Origin of Stability and Potential for magnetism in Carbon Materials," J. Am. Chem. Soc., 2005, 127, pp. 5917-5927.
Peng et al., "Graphene Quantum Dots Derived from Carbon Fibers," Nano Letters, 2012, 12, pp. 844-849.

\* cited by examiner (A)

(B)

(A)

(B)

(A)

(B)

NITROGEN-CONTAINING GRAPHENE STRUCTURE AND PHOSPHOR DISPERSION

FIELD OF THE INVENTION

The present invention relates to a nitrogen-containing graphene structure and a phosphor dispersion, more specifically, a novel nitrogen-containing graphene structure which can be used for probes for detecting a biochemical reaction, light emitting devices, LEDs, displays, fluorescent tags, and the like, and a phosphor dispersion using the structure.

BACKGROUND OF THE INVENTION

The term "phosphor" as used herein means a substance which absorbs light of a certain wavelength to excite electrons and emits light (fluorescence, phosphorescence) when the electrons thus excited fall back to the ground state.

As the phosphors, the followings are known:

(1) inorganic phosphors composed mainly of an oxide, a nitride, a sulfide, or the like and doped with ions serving as an emission center, (2) organic phosphors such as rare earth complexes, and (3) carbon phosphors such as carbon nanoparticles and graphene nanosheets.

Of these, graphene-based carbon phosphors are characterized by that they are excellent in electrical properties, thermal properties, and mechanical properties and in addition, are chemically stable.

There have conventionally been a variety of proposals on such phosphors made of a graphene-based material.

For example, Non-patent Document 1 discloses graphene quantum dots (GQDs) available by:

(1) using, as a starting raw material, micrometer-sized rippled graphene nanosheets (GSs) available by thermal reduction of graphene oxide (GO), (2) oxidizing the GSs in highly concentrated $H_2SO_4$ and $HNO_3$ to introduce, at the edge and on the basal plane, an oxygen-containing functional group such as C=O/COOH, OH, and C—O—C, (3) subjecting the oxidized GSs to hydrothermal treatment at 200° C., and (4) filtering and dialyzing the resulting colloid solution.

This document describes that:

(a) deoxidization occurs due to the hydrothermal treatment and the (002) spacing of the GQDs was reduced and became close to that of bulk graphite, (b) the size of the GSs decreased dramatically by the hydrothermal treatment and ultrafine GQDs (average diameter: 9.6 nm) can be isolated by a dialysis process, (c) the oxidized GSs show no detectable photoluminescence (PL) behavior, while the GQDs emit bright blue luminescence even in neutral media, (d) the GQDs shows a PL spectrum with a strong peak at 430 nm on excitation at the absorption band of 320 m, and (e) The PL quantum yield of the GQDs is 6.9%, comparable with those of luminescent carbon nanoparticles.

Non-patent Document 2 discloses GO thin films reduced with hydrazine vapor.

This document describes that:

(a) the PL characteristics of the GO originate from the recombination of electron-hole (e-h) pairs localized within small $sp^2$ carbon clusters embedded within an $sp^3$ matrix, (b) the absorbance of the GO increases with hydrazine exposure time, consistent with the evolution of oxygen (from ~39 at % in starting GO to 7~8 at % in the reduced GO), (c) the PL peak position of the GO thin films does not undergo a large change when subjected to reduction treatment and is centered around 390 nm, and (d) while the FL intensity of the GO thin films is weak for as-deposited GO films, short exposure to hydrazine vapor results in a dramatic increase in the PL intensities.

Further, Non-patent Document 3 discloses graphene quantum dots which have been synthesized through solution chemistry, contain 132 conjugated carbon atoms, and at the same time are enclosed in all three dimensions by three solubilizing 2',4',6'-trialkyl phenyl groups.

This document describes that:

(a) the graphene is stable in various organic solvents without aggregation, (b) when this graphene is dispersed in toluene and excited at 510 nm at room temperature, emission peaks appear at 670 nm and 740 nm, (c) the emission at 740 nm is phosphorescence and the time dependent behavior of it shows a single exponential decay with a time constant of 4 µs at room temperature, and (d) the emission at 670 nm is fluorescence and the dynamics of it can be fitted with a biexponential decay with time constants of 5.4 and 1.7 ns.

Carbon phosphors using a graphene nanosheet typically emit blue luminescence as described in Non-patent Documents 1 and 2. It is known that some of conventional inorganic phosphors contain a harmful element such as cadmium, but carbon phosphors do not require such a harmful element in order to achieve PL characteristics.

The emission efficiency of carbon phosphors so far reported is, however, 6.9% at the maximum as described in Non-patent Document 1. Further, carbon phosphors prepared by the conventional process have difficulty in controlling the emission wavelength as described in Non-patent Document 2.

CITATION LIST

Non-patent Documents

[Non-patent Document 1] D. Pan et al., Adv. Mater. 2010, 22, 734-738

[Non-patent Document 2] G. Eda et al., Adv. Mater. 2010, 22, 505-509

[Non-patent Document 3] M. L. Mueller et al., Nano Lett. 2010, 10, 2679-2682

SUMMARY OF THE INVENTION

A problem that the invention is to solve is to provide a novel nitrogen-containing graphene structure showing relatively high emission efficiency.

Another problem that the invention is to solve is to provide a novel nitrogen-containing graphene structure having no difficulty in controlling an emission wavelength.

A further problem that the invention is to solve is to provide a phosphor dispersion containing such a nitrogen-containing graphene structure.

With a view to overcoming the above-described problems, the nitrogen-containing graphene structure according to the invention includes a graphene structure having a monolayer or multilayer graphene nanosheet and nitrogen introduced into the graphene structure.

The nitrogen-containing graphene structure preferably includes:

the graphene structure having a sheet portion made of a monolayer or multilayer graphene nanosheet and containing, at an edge portion thereof, an armchair edge-face portion and a terminal six-membered ring bound to the armchair edge-face portion while sharing only one side therewith; and a nitrogen-containing functional group bound to any one or more carbon atoms selected from (a) carbon atoms constituting the terminal six-membered ring but not bound to the armchair edge-face portion, and (b) carbon atoms constituting the sheet portion (including the carbon atom on the side shared with the terminal six-membered ring).

Further, the phosphor dispersion according to the invention is obtained by dispersing the nitrogen-containing graphene structure of the invention in a solvent.

Introduction of nitrogen in a graphene structure or introduction of a nitrogen-containing functional group in any one or more carbon atoms constituting the sheet portion or terminal six-membered ring increases emission efficiency, which is presumed to occur because nitrogen thus introduced suppresses non-radiative recombination.

In addition, introduction of nitrogen in a graphene structure or introduction of a nitrogen-containing functional group in any one or more carbon atoms constituting the sheet portion or terminal six-membered ring makes the emission wavelength longer, which is presumed to occur because introduction of nitrogen causes energy transfer of excited electrons from a π* excited state to a lower n* excited state.

With an increase in the introduced amount of nitrogen or nitrogen-containing functional group, the interaction with the graphene structure, sheet portion, or terminal six-membered ring is enhanced, leading to an increase in a change in the emission wavelength. This means that the emission wavelength can be controlled by the amount of nitrogen or nitrogen-containing functional group.

In particular, when no nitrogen-containing functional group is introduced into the terminal six-membered ring, a change in emission wavelength decreases, while when a nitrogen-containing functional group is introduced into the terminal six-membered ring, a change in emission wavelength increases. A change in the emission wavelength can be increased by having a terminal six-membered ring, because it has a greater bound site of a nitrogen-containing functional group than the sheet portion.

DETAILED DESCRIPTION OF THE PREFERRED EMBODIMENTS

Figure 1:
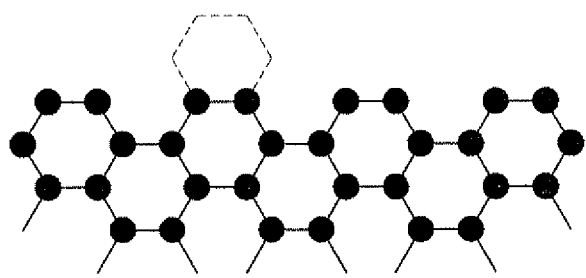
FIG. 1A is a schematic view of an armchair edge-face structure and FIG. 1B is a schematic view of a zigzag edge-face structure.
Figure 1:
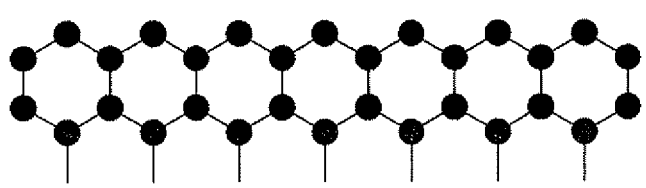

One embodiment of the invention will hereinafter be described specifically.

[1. Nitrogen-Containing Graphene Structure (1)]

The nitrogen-containing graphene structure has a graphene structure and nitrogen introduced into the graphene structure. Such a nitrogen-containing graphene structure can be obtained, as will be described later, by dispersing graphite oxide and/or graphene oxide in an aqueous solution having a nitrogen-containing compound dissolved therein and then heating the resulting dispersion at 60° C. or greater.

[1.1. Graphene Structure]

In the present embodiment, the term "graphene structure" means a graphene structure comprised of a monolayer or multilayer graphene nanosheet.

The term "graphene nanosheet" means a nanosheet:

(a) having at least partially a two-dimensional layered structure made of carbon atoms, (b) containing, in the main portion in the layer surface thereof, a carbon ring structure and an ($sp^2$ bonded) aromatic ring, and (c) containing less than 0.5 wt % nitrogen as an unavoidable impurity.

In order to exhibit PL characteristics, it is presumed that the graphene nanosheet is required to have, in an insulating matrix ($sp^3$ matrix) comprised of carbon atoms having an $sp^a$ hybrid orbital, a structure in which fine clusters ($sp^2$ clusters) made of carbon atoms having an $sp^2$ hybrid orbital have been embedded. In other words, in the graphene nanosheet exhibiting PL characteristics, $sp^2$ clusters are presumed to function as an emission center.

[1.2. Nitrogen]

In the present embodiment, the term "nitrogen-containing graphene structure" is a structure obtained by intentionally introducing nitrogen into a graphene structure made of a graphene nanosheet and as a result, having a nitrogen content of 0.5 wt % or greater.

In the present embodiment, the term "introducing nitrogen" means, (1) substituting some of the carbon atoms constituting the graphene nanosheet with nitrogen, (2) bonding a nitrogen-containing functional group onto the edge and/or basal plane of the graphene nanosheet, or (3) adsorbing a nitrogen-containing compound to the surface of the graphene nanosheet or between two nanosheets.

The nitrogen introduced into the graphene nanosheet may be present in any one form of substitution, bonding, or adsorption or may be present in any two or more forms of them.

In the present embodiment, the term "nitrogen-containing functional group" means a functional group containing nitrogen as a constituting element. Examples of the nitrogen-containing functional group include amino group, imino group, N-oxide group, N-hydroxy group, hydrazine group, nitro group, nitroso group, azo group, diazo group, and azide group.

In the nitrogen-containing graphene structure, any one of these nitrogen-containing functional groups may be bound to the graphene nanosheet or two or more of them may be bound thereto.

In the present embodiment, the term "nitrogen-containing compound" means a compound containing nitrogen as a constituting element and soluble or dispersible in water. Examples of the nitrogen-containing compound include (1) urea, ammonia, thiourea, hydrazine, nitrate esters, sodium nitrate, sodium nitrite, hydroxylamine, pyridine N-oxide, N-hydroxylalkyleneimine, sodium azide, sodium amide, and carboxylic acid azide (2) alkylamines such as methylamine, ethylamine, n-propylamine, isopropylamine, n-butylamine, tert-butylamine, n-pentylamine, and n-hexylamine and palates thereof, and (3) diamines such as ethylenediamine and propanediamine.

In the nitrogen-containing graphene structure, any one of these nitrogen-containing compounds may have adsorbed to the graphene nanosheet or any two or more of them may have adsorbed thereto.

[1.3. Nitrogen Content]

The nitrogen content in the nitrogen-containing graphene structure has an influence on the emission efficiency and emission wavelength.

In general, with an increase in the nitrogen content, the emission efficiency increases or a change in emission wavelength is enhanced. In order to achieve such an effect, the nitrogen content is required to be 0.5 wt % or greater. The nitrogen content is more preferably 1 wt % or greater, still more preferably 2 wt % or greater, still more preferably 5 wt % or greater.

On the other hand, when the nitrogen content increases excessively, the electron state undergoes a drastic change and PL characteristics cannot be achieved. The nitrogen content is therefore preferably 50 wt % or less. The nitrogen content is more preferably 40 wt % or less, still more preferably 30 wt % or less, still more preferably 20 wt % or less, still more preferably 10 wt % or less.

[1.4. Average Thickness]

The thickness of the nitrogen-containing graphene structure (that is, the number of stacked layers of sheet) has an influence on the emission efficiency and emission wavelength.

Even a monolayer nitrogen-containing graphene structure functions as a phosphor. The thickness of the monolayer graphene nanosheet is about 0.3 nm, which means that the nitrogen-containing graphene structure may have at least an average thickness of 0.3 nm or greater.

With an increase in the thickness of the nitrogen-containing graphene structure, the emission wavelength becomes longer, which is presumed to occur because the $\pi$-$\pi$* energy gap decreases with an increase in the size of $sp^2$ clusters in the sheet stacking direction.

When the nitrogen-containing graphene structure becomes excessively thick, however, the electron structure approximates to that of the bulk, making it impossible to achieve efficient visible light emission. The average thickness of the nitrogen-containing graphene structure is preferably 50 nm or less. The average thickness is more preferably 20 nm or less, still more preferably 10 nm or less, still more preferably 5 nm or less.

The term "average thickness of the nitrogen-containing graphene structure" means an average thickness of n pieces (n≥5) of the nitrogen-containing graphene structures selected at random.

Examples of a method for measuring the thickness include:

(1) a method of measuring the thickness of the sheet directly by using an atomic force microscope (AFM); and (2) a method of determining the thickness while considering an ideal thickness (0.34 nm) corresponding to one layer from the layer number of the sheet observed from a transmission electron microscope (TEM) photograph. Almost the same measurement results can be obtained by using either method.

[1.5. Average Size]

The size of the nitrogen-containing graphene structure has an influence on the emission efficiency and emission wavelength.

In general, with a decrease in the size of the nitrogen-containing graphene structure, the emission efficiency increases due to a quantum size effect, but the emission wavelength decreases. In order to achieve light emission in a visible light range, the average size of the nitrogen-containing graphene structure is preferably 1 nm or greater. The average size is more preferably 2 nm or greater, still more preferably 3 nm or greater.

On the other hand, when the nitrogen-containing graphene structure has an excessively large size, so-called "quenching" occurs, that is, re-absorption, to the sheet, of fluorescence emitted from the emission center, leading to a decrease in emission efficiency. The average size of the nitrogen-containing graphene structure is therefore preferably 1000 nm or less. The average size is more preferably 500 nm or less, still more preferably 100 nm or less.

The term "average size of the nitrogen-containing graphene structure" as used herein means an average size of n pieces (n≥5) of the nitrogen-containing graphene structures selected at random.

The term "size of the nitrogen-containing graphene structure" means a long diameter (length in the direction giving the maximum length) of the sheet plane.

[1.6. Emission Efficiency]

The nitrogen-containing graphene structure according to the present embodiment shows emission efficiency of 1% or greater. When the average thickness, average size, nitrogen content, or the like is optimized, the resulting nitrogen-containing graphene structure has more increased emission efficiency. More specifically, when they are optimized, the resulting nitrogen-containing graphene structure has emission efficiency of 7% or greater, 10% or greater, 15% or greater, or 20% or greater.

The term "emission efficiency" as used herein means a ratio of the number of photons emitted as fluorescence to the number of photons absorbed.

[2. Nitrogen-Containing Graphene Structure (2)]

The nitrogen-containing graphene structure according to the second embodiment of the invention is characterized in that:

(a) it is equipped with a graphene structure and nitrogen introduced into the graphene structure;

(b) the graphene structure has a sheet portion and a terminal six-membered ring; and (c) nitrogen is introduced into the graphene structure at least in a bound form (a nitrogen-containing functional group is bound to the carbon atom constituting the graphene structure).

[2.1. Graphene Structure]

In the present embodiment, the term "graphene structure" means a structure equipped with a sheet portion made of a monolayer or multilayer graphene nanosheet and containing, at the edge portion thereof, an armchair edge-face portion and a terminal six-membered ring bound to the armchair edge-face portion while sharing only one side therewith.

In the present embodiment, the term "graphene nanosheet" means a two-dimensional sheet-like structure comprised of a carbon ring structure and an $sp^2$ bonded aromatic ring and containing less than 0.5 wt % nitrogen as an unavoidable impurity.

In order to exhibit PL characteristics, it is presumed that the graphene nanosheet is required to have, in an insulating matrix ($sp^3$ matrix) comprised of carbon atoms having an $sp^3$ hybrid orbital, a structure in which fine clusters ($sp^2$ clusters) made of carbon atoms having an $sp^2$ hybrid orbital have been embedded. In other words, in the graphene nanosheet exhibiting PL characteristics, $sp^2$ clusters are presumed to function as an emission center.

[2.1.1. Sheet Portion]

In the present embodiment, the term "sheet portion" means a portion comprised of a monolayer or multilayer graphene nanosheet and containing, at the edge portion of the sheet, an armchair edge-face portion (refer to FIG. 1A). The edge portion of the sheet portion is desirably made only of this armchair edge-face portion, but may partially include a zigzag edge-face portion (refer to FIG. 1B).

In the present embodiment, the term "sheet portion" does not include, among six-membered rings constituting the graphene nanosheet, a terminal six-membered ring (indicated by a broken line in FIG. 1A) bound to the armchair edge-face portion via one side.

The sheet portion may be comprised of a monolayer graphene nanosheet or may be comprised of a multilayer graphene nanosheet.

[2.1.2. Terminal Six-Membered Ring]

In the present embodiment, the term "terminal six-membered ring" as used herein means a carbon six-membered ring bound to the armchair edge-face portion of the sheet portion while sharing only one side therewith.

FIG. 1A shows a terminal six-membered ring bound to an armchair edge-face portion. In FIG. 1A, the sheet portion is indicated by a solid line while the terminal six-membered ring is indicated by a broken line. To achieve high emission characteristics, the number of the terminal six-membered rings included in one sheet portion is preferably large.

[2.2. Nitrogen-Containing Functional Group]

In the present embodiment, the term "nitrogen-containing graphene structure" means a structure obtained by intentionally introducing nitrogen into a graphene structure equipped with a sheet portion and a terminal six-membered ring and having a nitrogen content of 0.5 wt % or greater.

As described above, the term "introducing nitrogen" means:

(1) substituting some of the carbon atoms constituting the graphene nanosheet with nitrogen;

(2) bonding a nitrogen-containing functional group onto the edge (including the atom on the side which is shared with the terminal six-membered ring) and/or basal plane of the graphene nanosheet; or (3) adsorbing a nitrogen-containing compound to the surface of the graphene nanosheet or between two nanosheets.

The nitrogen-containing graphene structure according to the present embodiment is characterized in that nitrogen has been introduced into the graphene structure at least in a bound form (the nitrogen-containing functional group is bound to the carbon atom constituting the graphene structure). The nitrogen-containing graphene structure may further contain nitrogen introduced in the form of substitution or adsorption.

The nitrogen-containing grapheme structure according to the present embodiment has a nitrogen-containing functional group bound to any one or more carbon atoms selected from:

(a) carbon atoms constituting the terminal six-membered ring but not bound to the armchair edge-face portion; and (b) carbon atoms constituting the sheet portion (including the carbon atom on the side shared with the terminal six-membered ring).

In the present embodiment, the term "nitrogen-containing functional group" means a functional group containing nitrogen as a constituting element. Examples of the nitrogen-containing functional group include amino group, imino group, N-oxide group, N-hydroxy group, hydrazine group, nitro group, nitroso group, azo group, diazo group, and azide group.

Any one of these nitrogen-containing functional groups may be bound to the terminal six-membered ring or sheet portion or any two or more of them may be bound thereto. When the nitrogen-containing functional group is bound to the terminal six-membered ring, the nitrogen-containing functional group may be bound to some of the terminal six-membered rings or the nitrogen-containing functional group may be bound to all the terminal six-membered rings.

[2.3. Nitrogen Content]

The nitrogen content in the nitrogen-containing graphene structure has an influence on the emission efficiency and emission wavelength. In general, with an increase in the nitrogen content, a change in emission wavelength increases. In order to achieve such an effect, the nitrogen content is required to be 0.5 wt % or greater. The nitrogen content is more preferably 1 wt % or greater, still more preferably 2 wt % or greater, still more preferably 5 wt % or greater.

On the other hand, when the nitrogen content increases excessively, the electron state undergoes a drastic change and PL characteristics cannot be achieved. The nitrogen content is therefore preferably 50 wt % or less. The nitrogen content is more preferably 40 wt % or less, still more preferably 30 wt % or less, still more preferably 20 wt % or less, still more preferably 10 wt % or less.

[2.4. Average Mass]

The average mass of the nitrogen-containing graphene structure has an influence on the emission efficiency and the emission wavelength.

The term "average mass" as used herein means an average value of the mass of the nitrogen-containing graphene structure per unit charge which can be obtained by measuring the mass spectrum. The average mass and the size of the nitrogen-containing graphene structure have a mutual relationship and the smaller the average mass, the smaller the size of the nitrogen-containing graphene structure.

In general, with a decrease in size of the nitrogen-containing graphene structure, the emission wavelength becomes shorter due to a quantum size effect. In order to achieve light emission in a visible light range, the average mass of the nitrogen-containing graphene structure is preferably 500 m/z or greater. The average mass is more preferably 1000 m/z or greater.

On the other hand, when the nitrogen-containing graphene structure has an excessively large size, light emission does not occur in a visible light range or so-called "quenching", that is, reabsorption, to the sheet, of fluorescence emitted from the emission center occurs, leading to a decrease in emission efficiency. The average mass of the nitrogen-containing graphene structure is therefore preferably 50000 m/z or less. The average mass is more preferably 10000 m/z or less, still more preferably 5000 m/z or less, still more preferably 3000 m/z or less.

[2.5. Average Thickness]

The thickness of the nitrogen-containing graphene structure (that is, the number of stacked layers of the sheet portion) has an influence on the emission efficiency and emission wavelength.

Even if the sheet portion is made of a single layer, it functions as a phosphor. The thickness of the monolayer graphene nanosheet is about 0.3 nm, which means that the grapheme structure may have at least an average thickness of 0.3 nm or greater.

With an increase in the thickness of the nitrogen-containing graphene structure, the emission wavelength becomes longer, which is presumed to occur because the $\pi$-$\pi^*$ energy gap decreases with an increase in the size of $sp^2$ clusters in the sheet stacking direction.

When the nitrogen-containing graphene structure becomes excessively thick, however, the electron structure approximates to that of the bulk, making it impossible to achieve efficient light emission. The average thickness of the nitrogen-containing graphene structure is therefore preferably 50 nm or less. The average thickness is more preferably 20 nm or less, still more preferably 10 ma or less, still more preferably 5 nm or less.

The term "average thickness of the nitrogen-containing graphene structures" means an average thickness of n pieces (n≥5) of the nitrogen-containing graphene structures selected at random.

Examples of a method for measuring the thickness include:
(1) a method of measuring the thickness of the sheet directly by using an atomic force microscope (AFM); and
(2) a method of determining the thickness while considering an ideal thickness (0.34 nm) corresponding to one layer from the layer number of the sheet observed from a transmission electron microscope (TEM) photograph. Almost the same measurement results can be obtained by using either method.

[2.6. Emission Efficiency]

The nitrogen-containing graphene structure according to the present embodiment shows emission efficiency of 1% or greater. When the average thickness (the number of stacked layers of the sheet portion), average size, nitrogen content, or the like is optimized, the resulting nitrogen-containing graphene structure has more increased emission efficiency. More specifically, when they are optimized, the resulting nitrogen-containing grapheme structures has emission efficiency of 7% or greater, 10% or greater, 15% or greater, or 20% or greater.

The term "emission efficiency" as used herein means a ratio of the number of photons emitted as fluorescence to the number of photons absorbed.

[2.7. Oxygen-Containing Functional Group]

The term "oxygen-containing functional group" means a functional group containing oxygen as a constituting element. The oxygen-containing functional group contains an oxygen atom so that it has a high electron withdrawing property. Examples of the oxygen-containing functional group include =O (quinone group).

It is known that the emission efficiency is reduced when the oxygen atom of an oxygen-containing functional group is directly bound to the carbon atom constituting a sheet portion or terminal six-membered ring. This will equally apply to the nitrogen-containing graphene structure of the present application. To achieve high emission efficiency, the amount of the oxygen-containing functional group is preferably smaller. More preferably, the nitrogen-containing graphene structure is free from the oxygen-containing functional group.

The term "free from the oxygen-containing functional group" means that a ratio of a peak area corresponding to C—O relative to the whole peak area is 1% or less when peak separation of XPS (X-ray photoelectron spectroscopy) C is spectrum is conducted.

[3. Process for Preparing a Nitrogen-Containing Graphene Structure]

A process for preparing the nitrogen-containing graphene structure according to the invention includes:
a dispersing step, that is, a step of dispersing graphite oxide or graphene oxide in an aqueous solution having a nitrogen-containing compound dissolved therein; and
a heating step, that is, a step of heating the resulting aqueous solution at 60° C. or greater.

[3.1. Dispersing Step]
[3.1.1. Nitrogen-Containing Compound]

The term "nitrogen-containing compound" means a compound containing nitrogen as a constituting element and soluble or dispersible in water.

Examples of the nitrogen-containing compound include:
(1) urea, ammonia, thiourea, hydrazine, nitrate esters, sodium nitrate, sodium nitrite, hydroxylamine, pyridine N-oxide, N-hydroxylalkyleneimine, sodium azide, sodium amide, and carboxylic acid azide;
(2) alkylamines such as methylamine, ethylamine, n-propylamine, isopropylamine, n-butylamine, tert-butylamine, n-pentylamine, and n-hexylamine, and halates thereof; and
(3) diamines such as ethylenediamine and propanediamine.

As the starting raw material, any one of these nitrogen-containing compounds may be used or two or more of them may be used in combination.

Of these, urea is particularly suited as the nitrogen-containing compound, because it tends to form a peptide bond with the oxygen-containing functional group in the graphite oxide or graphene oxide and has high reactivity. Ammonia is also suited as the nitrogen-containing compound because it tends to form an amino group due to a nucleophilic reaction with the oxygen-containing functional group in the graphite oxide or graphene oxide.

The nitrogen-containing compound is dissolved or dispersed in water and used as the aqueous solution thus obtained. The concentration of the nitrogen-containing compound contained in the aqueous solution is not particularly limited and the optimum concentration may be selected, depending on the kind of the starting raw material or required properties. The concentration of the nitrogen-containing compound is typically from 0.1 to 10 mol/L.

[3.1.2. Graphite Oxide and Graphene Oxide]

The term "graphite oxide" means a compound in which an oxygen-containing functional group (for example, —COOH group, —OH group, or —C—O—C— group) has been bound onto the edge and/or basal plane of the graphene layer constituting the graphite. Graphite oxide can be obtained, for example, by oxidizing graphite with an oxidizing agent (potassium permanganate, potassium nitrate, or the like) in a strong acid (concentrated sulfuric acid).

The term "graphene oxide" means a sheet-like substance available by delamination of graphite oxide. The graphene oxide can be obtained, for example, by dispersing graphite oxide in an aqueous solution and then exposing the resulting dispersion to ultrasonic waves.

In the invention, either one or both of graphite oxide before delamination or graphene oxide obtained by delamination may be used.

The graphite oxide and/or graphene oxide is added to the aqueous solution containing the nitrogen-containing compound. The amount of the graphite oxide and/or graphene oxide contained in the aqueous solution is not particularly limited and the optimum amount may be selected, depending on the kind of the starting raw material or required properties. The amount of graphite oxide and/or graphene oxide is typically from 0.1 to 50 g/L.

[3.2. Heating Step]

After graphite oxide and/or graphene oxide is dispersed in the aqueous solution having a nitrogen-containing compound dispersed therein, the resulting aqueous solution is heated. Heating is conducted in order to increase a reaction rate. When the heating temperature exceeds the boiling point of the aqueous solution, the heating is conducted in a hermetically sealed container.

When the heating temperature is too low, the reaction does not proceed sufficiently within a realistic time. Accordingly, the heating temperature is required to be 60° C. or greater. The heating temperature is more preferably 70° C. or greater, still more preferably 80° C. or greater.

When the heating temperature is too high, on the other hand, there is a possibility of nitrogen incorporated by substitution or bonding being disconnected. In addition, an expensive pressure-resistant container becomes necessary, which increases a manufacturing cost. The heating temperature is therefore preferably 260° C. or less. The heating temperature is more preferably 240° C. or less, still more preferably 220° C. or less, still more preferably 200° C. or less, still more preferably 180° C. or less, still more preferably 160° C. or less.

As the heating time, the optimum time is selected, depending on the heating temperature. In general, with an increase in the heating temperature, the reaction can be caused to proceed in a short time. The heating time is typically from 1 to 20 hours.

The nitrogen content, average thickness, and average size of the nitrogen-containing graphene structure can be controlled by optimizing the heating conditions. In general, with an increase in the heating temperature and/or with an increase in the heating time, the nitrogen content decreases, the average thickness decreases, or the average size decreases.

The nitrogen-containing graphene structure thus obtained may be used as it is for various applications or may be washed, filtered, and/or dialyzed as needed.

[4. Phosphor Dispersion]

The phosphor dispersion according to the invention is composed of a dispersion of the nitrogen-containing graphene structure of the invention in a solvent.

No particular limitation is imposed on the solvent and any solvent is usable insofar as it can uniformly disperse the nitrogen-containing graphene structure therein. Examples of the solvent include water and organic solvents, and mixtures thereof.

For example, the nitrogen-containing graphene structure is typically hydrophilic. In this case, a solvent containing any one selected from water and polar organic solvents is preferred.

The greater the nitrogen content, the more the nitrogen-containing graphene structure becomes hydrophobic. In such a case, a solvent containing one or more nonpolar organic solvents may be used.

The concentration of the phosphor dispersion is not particularly limited and the optimum concentration may be selected, depending on the intended use of it.

[5. Effect of Nitrogen-Containing Graphene Structure and Process for Preparing it, and Phosphor Dispersion]

Non-patent Document 1 describes that graphene quantum dots (GQDs) emitting blue luminescence can be obtained by subjecting a graphene nanosheets (GSs) having an oxygen-containing functional group introduced therein to hydrothermal treatment. By the process described in this document, however, only GQDs having a fluorescence wavelength peak at 430 nm can be obtained, because it is impossible to control the size of $sp^2$ clusters which determine the emission wavelength. In addition, these GQDs have low emission efficiency because of a small number of emission center sites.

On the other hand, Non-patent Document 2 describes that treatment of a graphene oxide thin film with hydrazine vapor enhances emission intensity.

By the process described in this document, however, only thin films of GSs having a fluorescence wavelength peak at 390 nm, that is, a near-ultraviolet light, can be obtained, because it is impossible to control the size of $sp^2$ clusters which determine the emission wavelength. In addition, it is known that when the thin films are treated with hydrazine vapor, only a small amount of nitrogen is bound thereto as a result of a reaction between the carbonyl group on the surface of graphene oxide and hydrazine, but a bound amount or bound state enough for influencing on the fluorescence wavelength cannot be attained.

On the other hand, by dispersing graphite oxide and/or graphene oxide in water and heating the resulting dispersion at a predetermined temperature, delamination of graphite oxide and reduction in size, into a nanosize, of sheet-like graphene oxide obtained by delamination occur. At the same time, a reduction reaction of the oxygen-containing functional group (for example, an epoxide group) bound to the graphite oxide or graphene oxide occurs, leading to an increase in the concentration of $sp^2$ clusters serving as an emission center.

At this time, a nitrogen-containing compound added to the aqueous solution causes reduction of the oxygen-containing functional group bound to the graphite oxide or graphene oxide and at the same time, causes substitution, bonding, and/or adsorption of nitrogen.

Alternatively, a terminal six-membered ring is formed simultaneously with the reduction of the oxygen-containing functional group and bonding of the nitrogen-containing functional group to the terminal six-membered ring or sheet portion occurs. In addition, substitution or adsorption of nitrogen occurs.

As a result, the graphene structure obtained by adding the nitrogen-containing compound has high emission efficiency compared with the graphene structure obtained without adding the nitrogen-containing compound. In addition, by controlling the nitrogen content, thickness of the sheet portion, the number of stacked layers of the sheet portion, and the like, the emission wavelength can be controlled relatively easily.

The emission efficiency can be enhanced by the introduction of nitrogen presumably because:

(1) non-radiative recombination is suppressed by the nitrogen-containing functional group introduced into the terminal six-membered ring;

(2) the structure has a small particle-size distribution, and does not have an oxygen-containing functional group (for example, a quinone group) having a high electron withdrawing property;

(3) due to the substitution of carbon in the sp³ matrix with nitrogen, the substituted region becomes an emission center analogous to sp² clusters and the concentration of emission centers increases; or (4) the nitrogen-containing functional group is bound to the carbon in the sp³ matrix and the bound region becomes an emission center analogous to the sp² cluster region, leading to an increase in the concentration of emission centers.

A change in emission wavelength occurs due to the introduction of nitrogen, presumably because:

(1) the nitrogen-containing functional group is introduced into the terminal six-membered ring;

(2) the carbon atom in sp² clusters is substituted with nitrogen;

(3) the nitrogen-containing functional group is bound to the carbon atom in the sp³ matrix; or (4) the nitrogen-containing compound adsorbs to the vicinity of sp² clusters so that electronic energy transfer occurs from a π* excited state which is an electron excited state of carbon to a lower n* excited state of nitrogen.

The nitrogen-containing graphene structure according to the invention has high emission efficiency and a variable emission wavelength so that it can be used for LED, display, and the like. In addition, it does not contain harmful elements, has high hydrophilicity, and has high affinity with biological substances so that it can be used for a biological substance fluorescent labeling agent for detecting a specific biological substance in the living body.

EXAMPLES

Example 1

1. Preparation of Phosphor Dispersion

Graphite oxide (0.1 g) was dispersed in 5 mL of a 30% aqueous ammonia solution. The aqueous solution thus obtained was heated at 120° C. for 10 hours in a hermetically sealed container. After heating, the solution was washed sufficiently to separate a nitrogen-containing graphene structure. The nitrogen-containing graphene structure thus obtained was dispersed again in water to obtain a phosphor dispersion.

2. Test Method

[2.1. Mass Analysis]
Mass analysis of the nitrogen-containing graphene structure was conducted using a time-of-flight mass spectrometer. An average mass was determined from the mass spectrum.

[2.2. Composition Analysis]
The contents of the oxygen-containing functional group and nitrogen were measured using an X-ray photoelectron spectrometer ("Quantera SXM", trade name, product of ULVUC PHI).

[2.3. Fluorescence Spectrum]
Fluorescence spectrum of the phosphor dispersion was measured using a spectrofluorometer ("FP-6500", trade name; product of JASCO).

[2.4. Emission Efficiency]
Emission efficiency was measured using a spectrofluorometer ("FP-6500", trade name; product of JASCO) and UV-VIS-NIR spectrophotometer ("UV-3600", trade name; product of Shimadzu Corporation). Absorbance and fluorescence intensity, at an excitation wavelength, of each of the phosphor dispersion and a dye molecule solution containing, as a dye molecule, quinine sulfate whose emission efficiency was known (emission efficiency in a 0.1 mol aqueous sulfate solution: 54%) were measured. Based on the comparison between them in the absorbance and fluorescence intensity, emission efficiency was calculated.

3. Results

Figure 2:
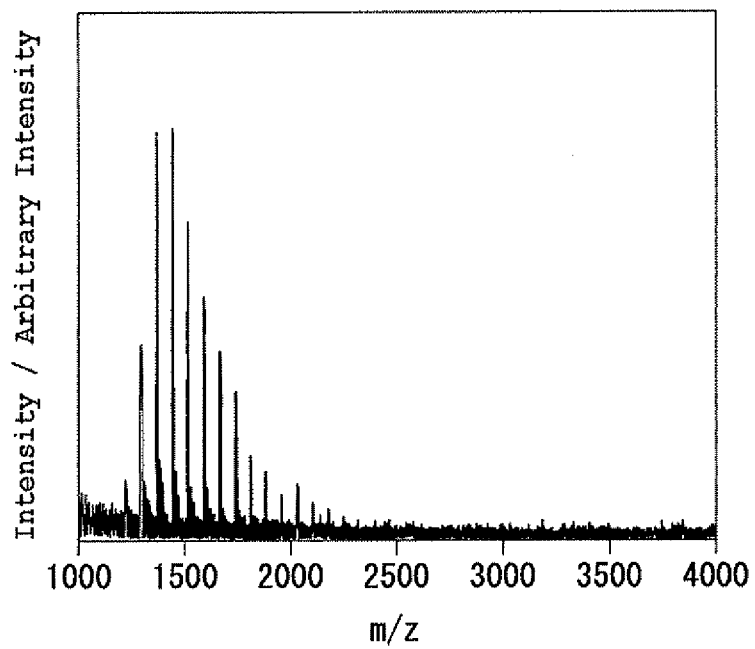
FIG. 2 is a mass spectrum of the nitrogen-containing graphene structure synthesized in Example 1.

FIG. 2 shows a mass spectrum of the nitrogen-containing graphene structure obtained in Example 1. It has been found from FIG. 2 that a nitrogen-containing graphene structure having an average mass of 1483 m/z has been formed. The spectrum is a regularly repeated pattern of the mass of +74 m/z, showing that a carbon six-membered ring is bound to the armchair edge-face of the graphene structure while sharing a side therewith. As will be described later, it has been found from the comparison between FIG. 2 and FIG. 5 that no nitrogen-containing functional group has been bound to the terminal six-membered ring of the nitrogen-containing graphene structure obtained in Example 1.

FIG. 3A and FIG. 3B show XPS spectra showing binding states of the oxygen-containing functional group (C 1s) and the nitrogen-containing functional group (N 1s) contained in the nitrogen-containing graphene structure obtained in Example 1, respectively. FIG. 3A also shows an XPS spectrum of a graphene structure obtained in Comparative Example 1 which will be described later.

Figure 3:
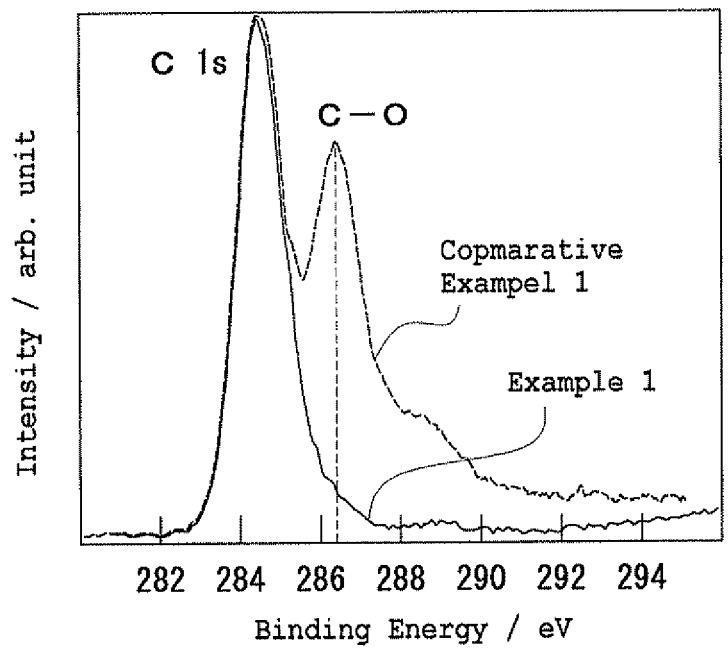
FIG. 3A is an XPS (X-ray photoelectron spectroscopy) spectrum showing a binding state of an oxygen-containing functional group (C 1s) of each of the nitrogen-containing graphene structures obtained in Example 1 and Comparative Example 1 and FIG. 3B is an XPS spectrum showing a binding state of a nitrogen-containing functional group (N 1s) of the nitrogen-containing graphene structure obtained in Example 1.
Figure 3:
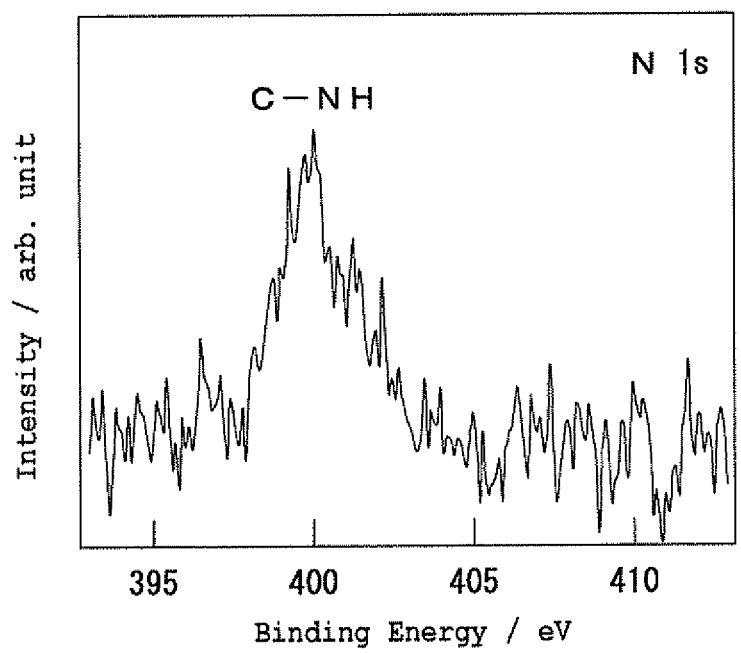

It has been found from FIG. 3A that a peak due to the binding state (C—O) derived from the oxygen-containing functional group, which causes a reduction in emission efficiency, is not observed from the structure obtained in Example 1. A ratio of a peak area of C—O to the whole peak area when peak separation of C 1s spectrum was conducted was 0.03%. It has also been found from the N 1s spectrum in FIG. 3B that a peak derived from an amino group is observed from the structure obtained in Example 1. In short, FIGS. 2 and 3 suggest that in the nitrogen-containing graphene structure obtained in Example 1, the nitrogen-containing functional group is bound only to the carbon atom constituting the sheet portion.

Figure 4:
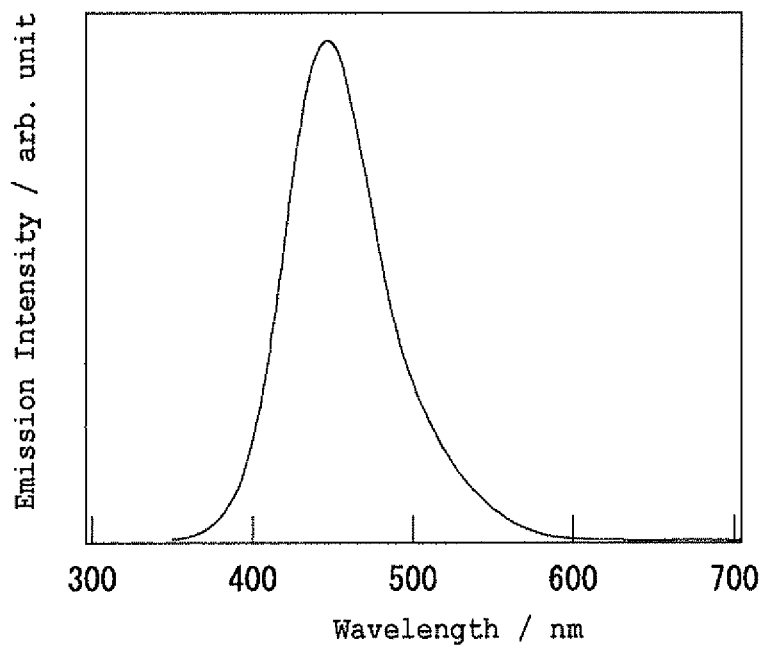
FIG. 4 is a fluorescence spectrum of the nitrogen-containing graphene structure synthesized in Example 1.

FIG. 4 is a fluorescence spectrum of the nitrogen-containing graphene structure obtained in Example 1. The graphene structure obtained in Example 1 had a peak position of the spectrum at 447 nm and a half width of the peak is 66 nm. In addition, the structure obtained in Example 1 had emission efficiency of 24%, much higher than that of Non-patent Document 1 (refer to Table 1). The structure obtained in Example 1 had a nitrogen content of 1.4 wt % (refer to Table 1).

Example 2

1. Preparation of Phosphor Dispersion

A phosphor dispersion was obtained in a similar manner to Example 1 except that heating conditions were changed to 80° C. and 10 hours.

2. Test Method

[2.1. Mass Spectrum, XPS Spectrum, Fluorescence Spectrum, Emission Efficiency, and Nitrogen Content]
Under similar conditions to those in Example 1, mass analysis and measurement of XPS spectrum, fluorescence spectrum, emission efficiency, and nitrogen content were conducted.

[2.2. Infrared Absorption Spectrum]
The infrared absorption spectrum of the nitrogen-containing graphene structure was measured using a Fourier transform infrared spectrophotometer.

3. Results

Figure 5:
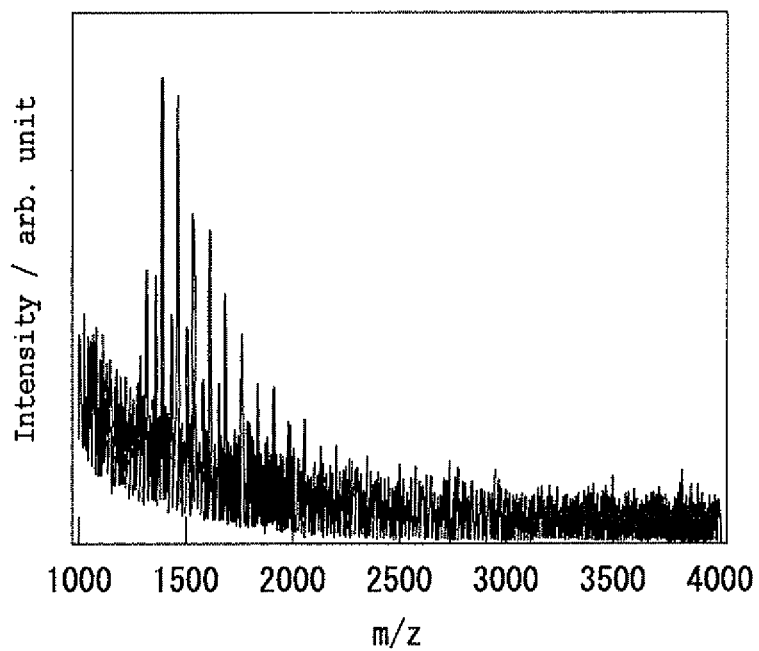
FIG. 5 is a mass spectrum of the nitrogen-containing graphene structure synthesized in Example 2.

FIG. 5 is a mass spectrum of the nitrogen-containing graphene structure obtained in Example 2. It has been found from FIG. 5 that a nitrogen-containing graphene structure having an average mass of 1512 m/z has been formed. The spectrum shows a regularly repeated pattern of mass of +74 m/z with a mass of 1236.4 m/z greater by +29 m/z than that of Example 1 as a starting point. This mass of +29 m/z owes to the nitrogen-containing functional group introduced into the terminal six-membered ring. A nitrogen-containing functional group has therefore been bound to the terminal six-membered ring of the nitrogen-containing graphene structure obtained in Example 2, while no nitrogen-containing functional group has been bound to the terminal six-membered ring of the nitrogen-containing graphene structure obtained in Example 1.

Figure 6:
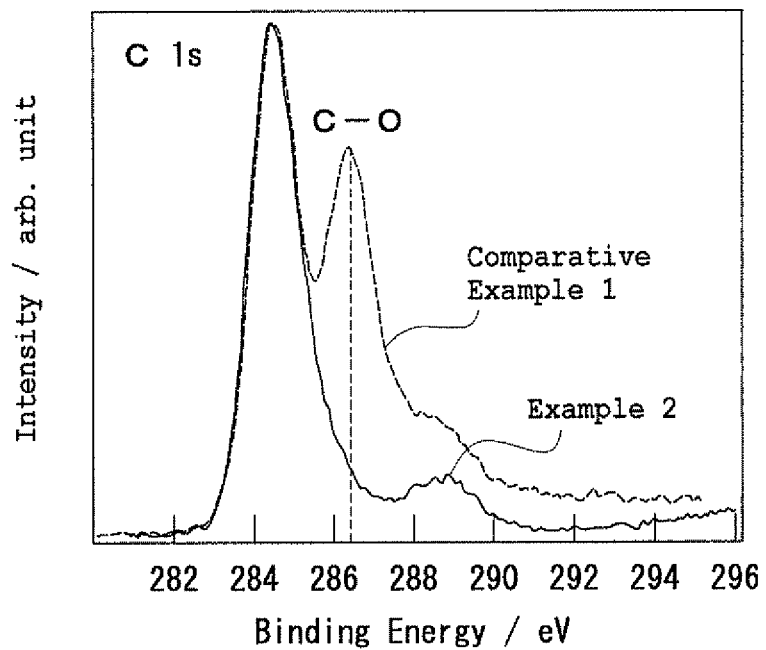
FIG. 6A is an XPS spectrum showing a binding state of an oxygen-containing functional group (C 1s) of each of the nitrogen-containing graphene structures obtained in Example 2 and Comparative Example 1 and FIG. 6B is an XPS spectrum showing a binding state of a nitrogen-containing functional group (N 1s) of the nitrogen-containing graphene structure obtained in Example 1.
Figure 6:
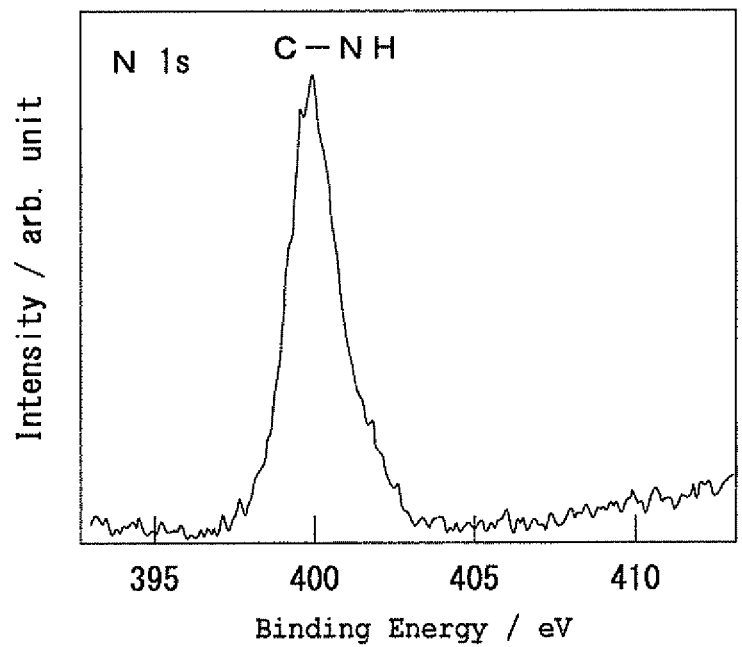

FIG. 6A and FIG. 6B are XPS spectra showing binding states of the oxygen-containing functional group (C1s) and the nitrogen-containing functional group (N 1s spectrum) contained in the graphene structure obtained in Example 2, respectively. FIG. 6A also shows an XPS spectrum of a graphene structure obtained in Comparative Example 1 which will be described later.

It has been found from FIG. 6A that from the structure obtained in Example 2, no peak due to the binding state (C—O) derived from the oxygen-containing functional group, which causes a reduction in emission efficiency, is observed. A ratio of a peak area of C—O to the whole peak area when the peak separation of a C 1s spectrum was conducted was 0.2%. From the N 1s spectrum in FIG. 6B, it has been found that a peak due to an amino group is observed from the structure obtained in Example 2.

Figure 7:
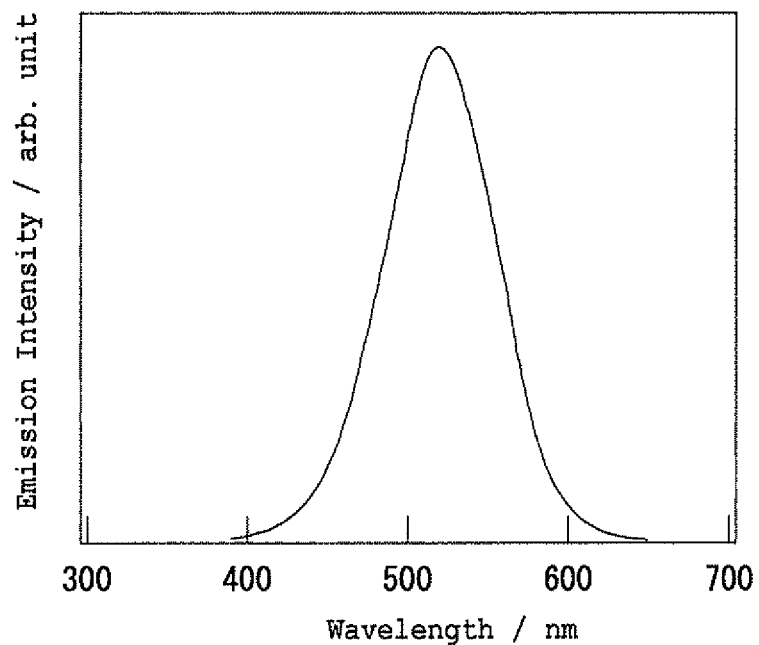
FIG. 7 is a fluorescence spectrum of the nitrogen-containing graphene structure synthesized by Example 2.

FIG. 7 is a fluorescence spectrum of the nitrogen-containing graphene structure obtained in Example 2. The structure obtained in Example 2 has a peak position of the spectrum at 521 nm and a half width of the peak was 87 nm. The structure obtained in Example 2 had emission efficiency of 19%, which was much higher than that of Non-patent Document 1 (refer to Table 1). The structure obtained in Example 2 had a nitrogen content of 13.9 wt % (refer to Table 1).

Figure 8:
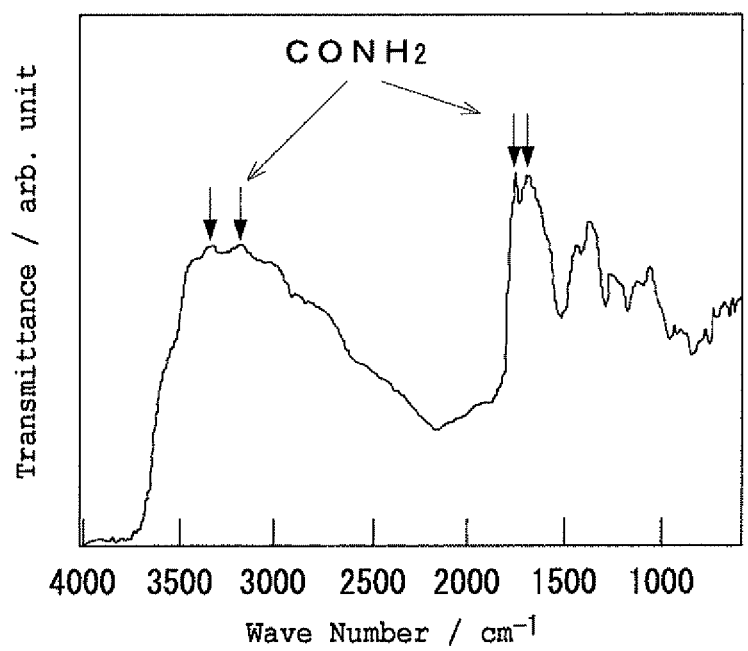
FIG. 8 is an infrared absorption spectrum of the nitrogen-containing graphene structure synthesized by Example 2.

FIG. 8 is an infrared absorption spectrum showing a vibrational state of the functional group contained in the nitrogen-containing graphene structure obtained in Example 2. In FIG. 8, down-pointing arrows each indicate a peak derived from —$CONH_2$ group. This graph shows that a peak due to an amide group (—$CONH_2$) which is a nitrogen-containing functional group is observed. This nitrogen-containing functional group has a mass greater than that of the nitrogen-containing functional group bound to the terminal six-membered ring, which suggests that the nitrogen-containing functional group is bound to the sheet portion as well as the terminal six-membered ring.

Comparative Example 1

1. Preparation of Phosphor Dispersion

In a similar manner to Example 1 except for the use of water instead of the aqueous ammonia solution, a phosphor dispersion having a graphene structure dispersed therein was obtained.

2. Test Method

Under similar conditions to those employed in Example 1, mass analysis and measurement of XPS spectrum, fluorescence spectrum, emission efficiency, and nitrogen content were conducted.

3. Results

The phosphor dispersion obtained in Comparative Example 1 had a peak position of the spectrum at 450 nm and a half width of the peak was 127 nm. It had, however, emission efficiency less than 1%. Moreover, the nitrogen content of the phosphor obtained in Comparative Example 1 was outside a detection limit.

Table 1 shows the fluorescence wavelength, half width, emission efficiency, and nitrogen content of the phosphor dispersions obtained in Examples 1 and 2, and Comparative Example 1

TABLE 1

| No. | Fluorescence Wavelength nm | Half Width nm | Emission Efficiency % | Nitrogen Content wt % |
|---|---|---|---|---|
| Example 1 | 447 | 66 | 24 | 1.4 |
| Example 2 | 521 | 87 | 19 | 13.9 |
| Comparative Example 1 | 450 | 127 | <1 | — |

Example 11

1. Preparation of Phosphor Dispersion

Graphite oxide (0.1 g) was dispersed in 5 mL of a 0.2 mol/l aqueous urea solution. The aqueous solution thus obtained was heated at 150° C. for 10 hours in a hermetically sealed container. After heating, the solution was washed sufficiently to separate a nitrogen-containing graphene structure. The nitrogen-containing graphene structure thus obtained was dispersed in water again to obtain a phosphor dispersion.

2. Test Method

[2.1. Observation with Transmission Electron Microscope (TEM)]
The nitrogen-containing graphene structure was observed with TEM. From the TEM photograph, the average thickness and average size of the sheet were measured.
[2.2. Fluorescence Spectrum]
Fluorescence spectrum to the phosphor dispersion was measured using a spectrofluorometer ("FP-6500", trade name; product of JASCO)
[2.3. Emission Efficiency]
Emission efficiency was measured using a spectrofluorometer ("FP-6500", trade name; product of JASCO) and a UV-VIS-NIR spectrophotometer ("UV-3600", trade name; product of Shimadzu Corporation). Absorbance and fluorescence intensity, at an excitation wavelength, of each of a phosphor dispersion and a dye molecule solution containing, as a dye molecule, quinine sulfate whose emission efficiency was known (emission efficiency in a 0.1 mol aqueous sulfate solution: 54%) were measured. Based on the comparison between them in the absorbance and fluorescence intensity, emission efficiency was calculated.

[2.4. Nitrogen Content]

A nitrogen content in the sheet was measured using a CHN corder ("vario Micro cube", trade name; product of Elementar).

3. Results

Figure 9:
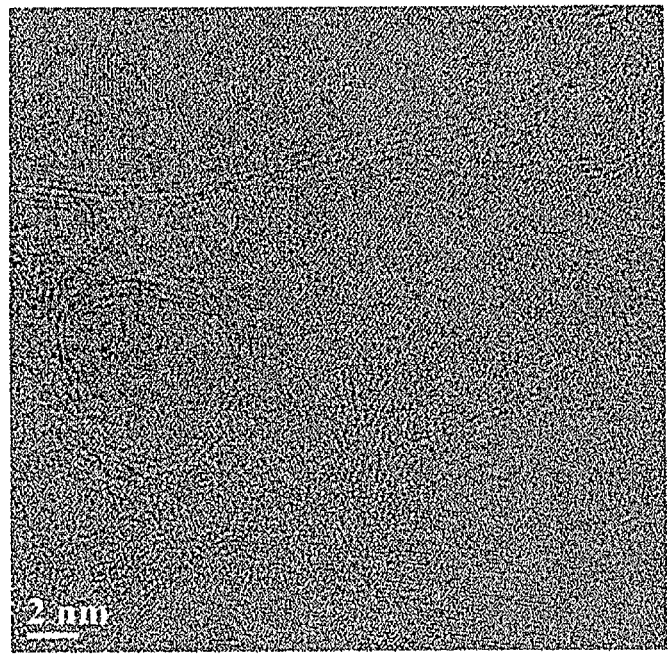
FIG. 9 is a TEM micrograph of the nitrogen-containing graphene structure synthesized in Example 11.

FIG. 9 is a TEM photograph of the nitrogen-containing graphene structure obtained in Example 11. It has been found From FIG. 9 that a nitrogen-containing graphene structure having an average thickness of about 2 nm and an average size of about 10 nm has been formed.

Figure 10:
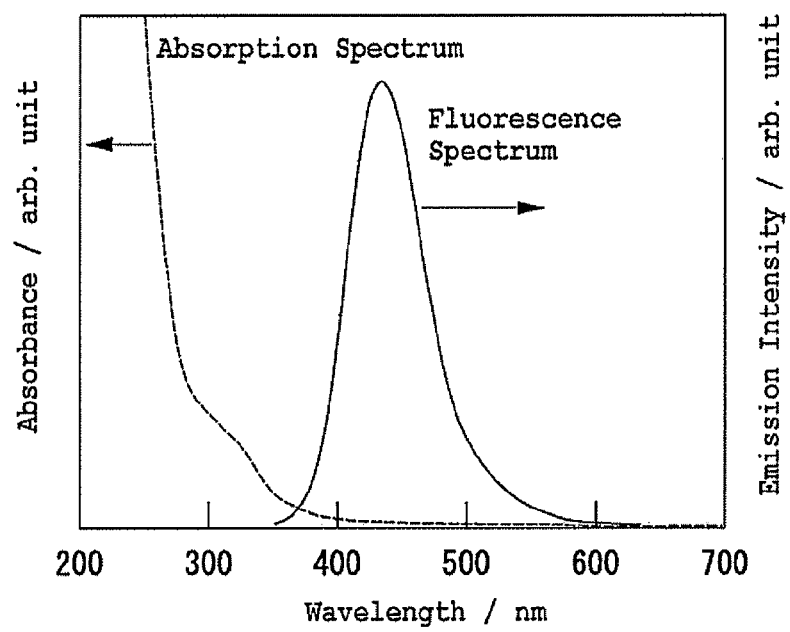
FIG. 10 is a fluorescence spectrum of the nitrogen-containing graphene structure synthesized in Example 11.

FIG. 10 is a fluorescence spectrum of the nitrogen-containing graphene structure obtained in Example 11. The graphene structure obtained in Example 11 had a peak position of the spectrum at 430 nm and a half width of the peak was 67 nm. The graphene structure obtained in Example 11 had emission efficiency of 24%, which was much higher than that of Non-patent Document 1 (refer to Table 2). In addition, it had a nitrogen content of 8.1% (refer to Table 2).

Example 12

1. Preparation of Phosphor Dispersion

In a similar manner to Example 11 except that the heating conditions were changed to 80° C. and 10 hours, a phosphor dispersion was obtained.

2. Test Method

Under similar conditions to those employed in Example 11, TEM observation and measurement of fluorescence spectrum, emission efficiency, and nitrogen content were conducted.

3. Results

Figure 11:
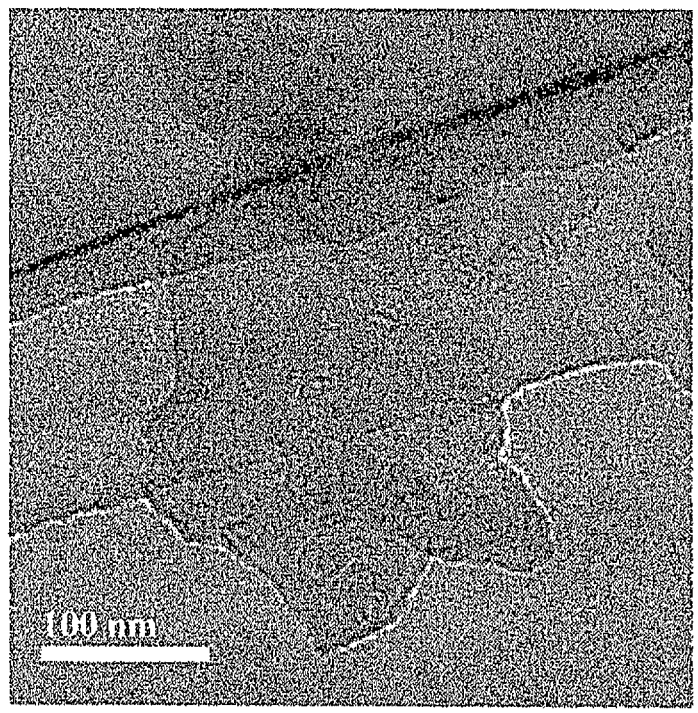
FIG. 11 is a TEM micrograph of the nitrogen-containing graphene structure synthesized in Example 12.

FIG. 11 is a TEM photograph of the nitrogen-containing graphene structure obtained in Example 12. It has been found from FIG. 11 that a nitrogen-containing graphene structure having an average thickness of about 10 nm and an average size of about 200 nm has been formed.

Figure 12:
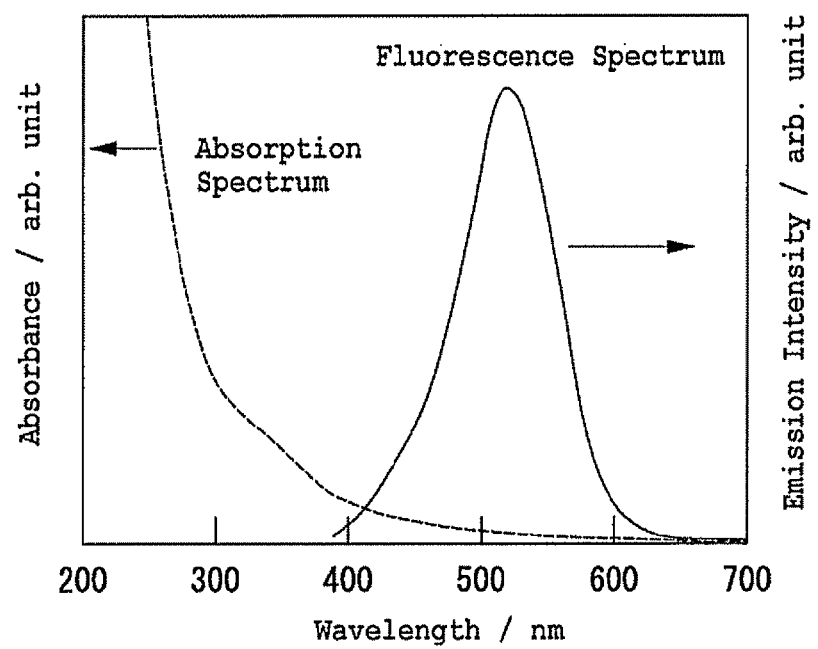
FIG. 12 is a fluorescence spectrum of the nitrogen-containing graphene structure synthesized in Example 12.

FIG. 12 is a fluorescence spectrum of the nitrogen-containing graphene structure obtained in Example 12. The nitrogen-containing graphene structure obtained in Example 12 had a peak position of the spectrum at 520 nm and a half width of the peak was 85 nm. The structure obtained in Example 12 had emission efficiency of 19%, which was much higher than that of Non-patent Document 1 (refer to Table 2). Moreover, the structure obtained in Example 12 had a nitrogen content of 7.8 wt % (refer to Table 2).

Comparative Example 11

1. Preparation of Phosphor Dispersion

In a similar manner to Example 11 except for the use of water instead of the aqueous urea solution, a phosphor dispersion having a nitrogen-free graphene nanosheet dispersed in water was obtained.

2. Test Method

Under similar conditions to those employed in Example 11, TEM observation and measurement of fluorescence spectrum, emission efficiency, and nitrogen content were measured.

3. Results

The phosphor dispersion obtained in Comparative Example 11 had a peak position of the spectrum at 450 nm and a half width of the peak was 127 nm. It had, however, emission efficiency less than 1% (refer to Table 2).

Moreover, the nitrogen content of the phosphor obtained in Comparative Example 11 was not greater than a detection limit (refer to Table 2).

TABLE 2

| No. | Fluorescence Wavelength nm | Half Width nm | Emission Efficiency % | Nitrogen Content wt % |
|---|---|---|---|---|
| Example 11 | 430 | 67 | 24 | 8.1 |
| Example 12 | 520 | 85 | 19 | 7.8 |
| Comparative Example 11 | 450 | 127 | <1 | — |

The embodiments of the invention were so far described specifically. The invention is, however, not limited to or by these embodiments and can be changed without departing from the gist of the invention.

The nitrogen-containing graphene structure and phosphor dispersion according to the invention can be used for a probe for detecting a biochemical reaction, a light emitting device, LED, display, fluorescent tag, and the like.

What is claimed is:

1. A nitrogen-containing graphene structure, comprising:
a graphene structure having a sheet portion comprised of a monolayer or multilayer graphene nanosheet; and
nitrogen introduced into the graphene structure,
wherein:
the sheet portion comprises, at an edge portion thereof, an armchair edge-face portion and a terminal six-membered ring bound to the armchair edge-face portion while sharing only one side therewith,
the nitrogen comprises nitrogen introduced into the graphene structure in the form of one or more amino groups and amide groups bound to one or more carbon atoms selected from:
  (a) carbon atoms constituting the terminal six-membered ring but not bound to the armchair edge-face portion, and
  (b) carbon atoms constituting the sheet portion including the carbon atom on the side shared with the terminal six-membered ring,
the nitrogen-containing graphene structure has an average mass of 1000 m/z to 50000 m/z,
the nitrogen-containing graphene structure has a nitrogen content of 5 wt % to 50 wt %, and
the nitrogen-containing graphene structure emits light and has an emission efficiency of 15% or greater.

2. The nitrogen-containing graphene structure according to claim 1, not containing, in the structure thereof, an oxygen-containing functional group having an oxygen atom directly bound to the carbon atom constituting the sheet portion or the terminal six-membered ring.

3. The nitrogen-containing graphene structure according to claim 1, obtained by dispersing graphite oxide and/or graphene oxide in an aqueous solution having a nitrogen-containing compound dissolved therein and then heating the resulting aqueous solution at 60° C. or greater.

4. A phosphor dispersion obtained by dispersing the nitrogen-containing graphene structure according to claim 1 in a solvent.

\* \* \* \* \*